United States Patent [19]

Logothetis

[11] Patent Number: 4,973,634

[45] Date of Patent: *Nov. 27, 1990

[54] PREPARATION OF BROMO-CONTAINING PERFLUOROPOLYMERS HAVING IODINE CURESITES

[75] Inventor: Anestis L. Logothetis, Wilmington, Del.

[73] Assignee: E. I. Du Pont de Nemours and Company, Wilmington, Del.

[*] Notice: The portion of the term of this patent subsequent to Aug. 14, 2007 has been disclaimed.

[21] Appl. No.: 354,194

[22] Filed: May 19, 1989

[51] Int. Cl.$^5$ .............................................. C08F 16/24
[52] U.S. Cl. ...................................... 526/247; 526/206
[58] Field of Search ........................ 526/206, 254, 247

[56] References Cited

U.S. PATENT DOCUMENTS

| | | | |
|---|---|---|---|
| 3,351,619 | 11/1967 | Warnell | 260/80.76 |
| 4,035,565 | 7/1977 | Apotheker et al. | 526/249 |
| 4,243,770 | 1/1981 | Tatemoto et al. | 525/331 |
| 4,413,094 | 11/1983 | Aufdermarsh, Jr. | 525/187 |
| 4,487,903 | 12/1984 | Tatemoto et al. | 526/247 |
| 4,529,784 | 7/1985 | Finlay | 526/247 |
| 4,564,662 | 1/1986 | Albin | 526/249 |
| 4,612,357 | 9/1986 | Bekiarias et al. | 526/249 |

FOREIGN PATENT DOCUMENTS 0153848  9/1985  European Pat. Off. .

Primary Examiner—Joseph L. Schoffer
Assistant Examiner—N. Sarofim
Attorney, Agent, or Firm—Donald W. Huntley

[57] ABSTRACT

A process for the preparation of perfluoropolymer by the random interpolymerization of tetrafluoroethylene, perfluoro (alkyl vinyl) ether and bromo curesite reactant, and the improvement wherein the interpolymerization reactants further comprise compounds of the formula $RI_n$, in which R is a hydrocarbon or halocarbon radical and n is 1 or 2.

11 Claims, No Drawings

PREPARATION OF BROMO-CONTAINING PERFLUOROPOLYMERS HAVING IODINE CURESITES

BACKGROUND OF THE INVENTION

Perfluoroelastomers have long been used in a variety of applications that require excellent resistance to high temperature and chemical attack. One particualrly outstanding fluoropolymer that has been used in elastomeric applications is that prepared from tetrafluoroethylene (TFE) and perfluoro (alkyl vinyl) ether, and particularly perfluro (methyl vinyl) ether (PMVE). To facilitate the crosslinking in these copolymers that is essential to good elastomeric properties, a small percentage of termonomer is generally incorporated, such as the bromo-containing fluoroolefins described in Apotheker, U.S. Pat. No. 4,035,565.

While these bromo perfluoroelastomers have exhibited outstanding thermal and oxidative stability, continuing effort has been directed to further modification of these polymers to broaden the areas in which they can be used. Particular attention has been paid to the rate and thoroughness of the curing reaction that has been used with perfluoroelastomers. Specifically, the perfluoropolymers previously made from TFE, PMVE and a cure site monomer typically exhibit a high concentration of ionic end groups, such as carboxylic or sulfonic acid moieties, which are introducted from the initiating system. Conventional chain transfer agents can be used to lower the concentration of the ionic end groups and also lower the polymer viscosity. However, the physical properties of these polymers are generally depreciated with such chain transfer agents.

SUMMARY OF THE INVENTION

The instant invention relates to the preparation of improved perfluoropolymer compositions which, when compounded and cured as elastomers, exhibit an excellent combination of curing and mold release characteristics.

Specifically, the present invention provides, in a process for the preparation of perfluoropolymer by the copolymerization of tetrafluoroethylene, perfluoro (alkyl vinyl) ether and bromine-containing curesite monomer, the improvement wherein the reactants further comprise compounds of the formula $RI_n$, in which R is a hydrocarbon or perhalocarbon radical and n is 1 or 2.

Preferably, the $RI_n$ is present in a concentration which provides iodo moieties in an amount of least about 0.05 percent by weight in the resulting perfluoropolymer.

DETAILED DESCRIPTION OF THE INVENTION

The basic components of the perfluoropolymers resulting from the instant process, the tetrafluoroethylene and the perfluoro (alkyl vinyl) ether, and their polymerization, are desribed in Harris et al, U.S. Pat. No. 3,132,123, which is hereby incorporated by reference. Of the perfluoro (alkyl vinyl) ethers, perfluoro (methyl vinyl) ether (PMVE) has been found to be particularly satisfactory. Other perfluoro (alkyl vinyl) ethers which can be used in the present invention include perfluoro (alkoxy alkyl vinyl) ethers, such as those described in Fritz et al., U.S. Pat. No. 3,291,843, also hereby incorporated by reference. Of those perfluoro (alkoxy alkyl vinyl) ethers, perfluoro (5-methyl-3,6-dioxa-1-nonene) has been found to be particularly satisfactory.

A wide variety of bromo- cure sites can be incorporated into these polymers, including those described in Apotheker et al., U.S. Pat. No. 4,035,565, hereby incorporated by reference. The polymers resulting from the process of this invention preferably contain such curesites randomly distributed along the backbone of the perfluoropolymer.

A central aspect of the present invention is that the perfluoropolymer comprise iodine moieties. The iodo moieties can be incorporated by conducting the radical copolymerization of the basic monomers noted above in the presence of an iodine-containing compound represented by the formula $RI_x$, where R is a hydrocarbon or saturated fluorocarbon or chlorofluorocarbon residue having 1 to 8 carbon atoms and x is an integer of 1 or 2, corresponding to the valence of the residue R.

In the course of the radically initiated copolymerization, the iodo compound acts as a chain transfer agent, resulting in a telomerization polymerization process in which a labile, iodine-containing chain end is formed, and the haloalkyl residue of the iodo compound is attached to the other end of the polymer chain. If the iodo compound has two iodo groups, the fluoropolymer chain may therefore have iodine groups at each end, and the telomerization polymerization process will occur at each end of the polymer chain.

Iodo-compounds which can be used in the preparation of the perfluoropolymers according to the present invention include, for example, those based on hydrocarbon residue such as methylene iodide, 1,4-diiodo butane, and butyl iodide, and those based on saturated fluorocarbon or chlorofluorocarbon residue such as monoiodo perfluoromethane, diiodo methane, monoiodo perfluoroethane, monoiodo perfluoro propane, monoiodopropane, 1,3-diiodoperfluoro-n-propane, 1,4-diiodo-n-butane, 1,4-diiodoperfluoro-n-butane, 1,3-diiodo-2-chloroperfluoro-n-propane and 1,5-diiodo-2,4-dichloro-perfluoro-n-pentane. Other iodo-compounds which can be used include those described in U.S. Pat. No. 4,243,770, hereby incorporated by reference.

The amount of iodo-compound used should be high enough to give extensive chain transfer and result in incorporation of at least about 0.05 weight % of iodine in the perfluoropolymer. High chain transfer efficiency by the alkyl iodide results in a perfluoropolymer with lower compound viscosity and a relatively narrow molecular weight distribution with a typical value of Mw/Mn of about 2–3, for desirable rheology and processing characteristics.

In general, the concentration of iodine in the polymer should be about from 0.05 to 1.0 weight %, and preferably 0.1–0.5 weight %, based on the perfluoropolymer composition. The concentration in the fluoropolymer will depend upon the concentration of alkyl iodides in the polymerization medium and upon polymerization conditions, which will effect the chain transfer efficiency. The upper limit on iodine content corresponds approximately to the practical lower limit on polymer viscosity, since higher concentrations of iodine gives polymers with lower molecular weight and viscosity. The iodine concentration in the perfluoropolymer can be determined by conventional analytical techniques, such as elemental analysis.

The lower limit of iodine incorporation is approximately that at which a significant effect on the cure rate and vulcanizate properties is found, when cured with peroxides. The upper limit on iodine content corresponds approximately to the practical lower limit on polymer viscosity, since higher concentrations of iodine gives polymers with lower molecular weight and viscosity. The upper limit on iodine content also relates to the desired highest state of cure, insofar as it relates to the efficiency of formation of chains terminated with iodo groups.

The components of the perfluoropolymers are present in the amounts generally used in the preparation of copolymers of tetrafluoroethylene, perfluoro (alkyl vinyl) ether and cure site monomer, as described, for example, in the aforementioned U.S. Pat. No. 4,035,565. Concentrations of about from 0.1 to 0.5 weight % bromine have been found to provide particularly good processing characteristics.

According to the process of the present invention the perfluoropolymers can be made by free radical emulsion polymerization in a continuous stirred tank reactor, as described, for example, in the aforementioned U.S. Pat. No. 4,035,565, and under the general reaction conditions used in the past for the preparation of perfluoropolymers. Specifically, polymerization temperatures can be in the range of about from 40° to 130° C., and preferably about from 70° to 115° C., at pressures of about from 2 to 8 MPa and residence time 10 to 240 minutes. Free radical generation is effected using a water-soluble initiator such as ammonium persulfate, either by thermal decomposition or by reaction with a reducing agent such as sodium sulfite. The alkyl iodides can be fed into the reactor directly or as a solution. Initiator levels are set low enough so that iodine end groups predominate over those from initiator fragments. This leads to the desired low polymer viscosity and high solubility. The polymer dispersion is stabilized with an inert surface-active agent such as ammonium perfluorooctanoate, usually with addition of a base such as sodium hydroxide or a buffer such as disodium phosphate to control pH in the range 3 to 7.

After polymerization, unreacted monomer is removed from the reactor effluent latex by vaporization at reduced pressure. Polymer can be recovered from latex by coagulation, e.g., by reducing pH to about 3 by acid addition and adding a salt solution such as calcium nitrate, magnesium sulfate, or potassium aluminum sulfate in water, followed by separation of serum from polymer, washing with water, and drying of the wet polymer. The iodine concentration in the perfluoropolymer can be determined by conventional analytical techniques, such as elemental analysis.

Perfluoropolymers prepared according to the process of the present invention are typically compounded with one or more of the additives known to be useful in perfluoropolymer compositions, such as pigments, fillers, pore-forming agents and plasticizers. It is particularly advantageous to add carbon black to the fluoroelastomer to increase its modulus. Usually amounts of from 5-50 parts per hundred parts of fluoroelastomer are used, with the particular amount determined from the particle size of the carbon black and the desired hardness and modulus of the cured composition.

The compounds are generally cured by a free radical process. A curable composition comprises polymer and a peroxide to generate free radicals at curing temperatures. A dialkyl peroxide which decomposes at a temperature above 50° C. is especially preferred when the composition is to be processed at elevated temperatures before it is cured. A di-tertiarybutyl peroxide having a tertiary carbon atom attached to peroxy oxygen may be particularly beneficial in many cases. Among the most useful peroxides of this type are 2,5-dimethyl-2,5-di(tertiarybutylperoxy) hexyne-3 and 2,5-dimethyl-2,5-di(tertiarybutylperoxy) hexane. Other peroxides can be selected from such compounds as dicumyl peroxide, dibenzoyl peroxide, tertiarybutyl perbenzoate, and di[1,3-dimethyl-3-(t-butylperoxy) butyl]carbonate, and the like.

The resulting perfluoroelastomers exhibit particularly good processing characteristics, including curing and mold release properties. Perfluoroelastomers of TFE, PMVE and cure site monomer have typically been difficult to process in milling, extrusion and molding operations, because of their high bulk viscosities. While the superior performance of the present compositions is not fully understood, it is believed that the selection of iodo compounds, which function as chain transfer agents, results in iodo end groups for the polymer chains, and these end groups are reactive to crosslinking agents. When used in conjunction with the known bromine cure sites, the iodides permit the curing of relatively low molecular weight polymers with peroxides to give parts with very good properties. The polymers can be cured with greater ease and with high yields. In addition, complicated parts which could not be made with previously available perfluoroelastomers can be fabricated with the present perfluoroelastomers using transfer and injection molding techniques.

The perfluoropolymers per se, without fillers or curing, can also be used in a wide variety of applications. In addition to the usual applications for which perfluoroelastomers have previously been found to provide particular benefits, the present compositions have been found to be particularly useful as antireflective coatings for pellicles, for example, in the protection of printed circuits. Specifically, a coating of perfluoroelastomers of the present invention of about from 0.2 to 1.0 microns, on a substrate of nitrocellulose, provides a pellicle material having an outstanding combination of adhesion to both the nitrocellulose film and to the pellicle frame as well as excellent optical transmittance.

The present invention is further illustrated by the following specific examples.

EXAMPLES 1-3 AND CONTROL EXAMPLE A

In Examples 1-3, perfluoroelastomers were prepared from TFE/PVE/Bromo containing fluorinated monomer, together with perfluoroalkyl iodides (RfI or IRfI), which provided iodo moieties on the ends of some of the polymer chains. The bromo cure site in these polymers is randomly dispersed in the backbone.

In Example 1, terpolymer was prepared from tetrafluoroethylene (TFE), perfluoro(methyl vinyl) ether (PMVE) and 1-Bromo-1,1,2,2-tetrafluoro-3-butene (BTFB). The polymer was prepared in a 1 liter mechanically agitated, waterjacketed, stainless-steel autoclave operated continuously at 90° C. and 4800 KPa into which was pumped, at a rate of 250 ml/hr an aqueous polymerization medium/initiator solution comprising of 8 liters of water, 26 g. ammonium persulfate, 260 g. of disodium hydrogen phosphate heptahydrate, and 280 g. of ammonium perfluoroctanoate ("Fluorad" FC-143, 3M Co.). At the same time, a separate solution of 1-bromo-1,1,2,2-tetrafluoro-3-butene in F-113 "Freon" at the rate of 4.0 ml/hr (the solution contained 0.8 g of 1-bromo-1,1,2,2-tetrafluoro-3-butene, the rest being F-

113) and another separate solution of 2.6 ml/hr of 1,4-diiodoperfluorobutane in F-113 (0.52 g. the rest being F-113) were being pumped in. A gaseous stream of tetrafluoroethylene (60 g/hr) and perfluoro(methyl vinyl) ether (75 g/hr) was also fed simultaneously to the autoclave at a consant rate by means of a diaphragm compressor.

Polymer latex was removed by means of a let-down valve and unreacted monomers were vented. The latex from 8 hrs operations, 4.1 kgs., was added with stirring to a preheated (95° C.) coagulating solution consisting of 140 g $MgSO_4.7H_2O$ in 40 liters of water. The coagulated crumb was filtered off, washed repeatedly with water and dried by heating in an 80° C. oven for 48 hrs in the presence of air. The dried polymer weighed 1410 gs. and had the composition, as weight % of the polymer, of tetrafluoroethylene 54.3, perfluoro(methyl vinyl) ether 44.7, bromotetrafluoroethylene 0.82 and iodine 0.20. The inherent viscosity of the polymer was determined at 30° C. using 0.2 g. of polymer per deciliter of a solvent mixture comprising (by volume) 60 parts 2,2,3-trichloro-heptafluorobutane, 40 parts perfluoro(butyltetrahydrofuran) and 3 parts diethylene glycol dimethyl ether. The Mooney viscosity of the polymer was measured after 10 minutes as 68 at 100° C. and 30 at 121° C. The resulting polymer was mixed on a 2-roll rubber mill with (phr) 15 MT black, 3 triallyl isocyanurate, and 5 Luperco 101XL (Lubrizol Co) peroxide, and shaped and cured at 177° C. and postcured at 232° C. unrestrained under nitrogen for 26 hrs. The results are shown in Table 1.

In Examples 2 and 3, the above procedure was repeated, except that the 1.4-diiodoperfluorobutane was fed at the rate 0.76 g/hr in Example 2 and 1.04 g/hr in Example 3. In Control Example A, the procedure was run under identical conditions except 1.3 g/hr of bromotetrafluorobutene was pumped to the reactor and no 1,4-diiodoperfluorobutane was used. The resulting polymers were tested as before, and the results are shown in Table 1.

TABLE 1

IODOMODIFIED ($I(CF_2)_4I$) BTFB CONTAINING TFE/PMVE POLYMER

| Examples | Control | 1 | 2 | 3 |
|---|---|---|---|---|
| Raw Polymer Description | | | | |
| TFE wt % | 55.6 | 54.3 | 54.8 | 56.0 |
| PMVE wt % | 43.2 | 44.7 | 43.9 | 42.6 |
| BTFB wt % | 1.16 | 0.82 | 0.87 | 0.89 |
| BTFB mol/kg | 0.055 | 0.041 | 0.039 | 0.043 |
| I wt % | — | 0.2 | 0.41 | 0.52 |
| I mol/kg | — | 0.016 | 0.032 | 0.041 |
| Inh. Viscosity | 0.48 | 0.37 | 0.31 | 0.27 |
| Mooney at 100° C. | — | 68.0 | 32.0 | 20.0 |
| 121° C. | 144.0 | 30.0 | 10.0 | 5.0 |
| Cured Properties | | | | |
| ODR 177° C. | | | | |
| Minimum - N.m | 1.7 | 0.5 | 0.2 | 0.1 |
| mH - N.m | 2.55 | 4.9 | 4.25 | 5.4 |
| ts2 - Mins | 1.8 | 0.75 | 0.9 | 0.75 |
| Tc90 - Mins | 2.5 | 1.5 | 1.5 | 1.5 |
| Tensiles | | | | |
| M100 | 926 | 1331 | 1798 | 1869 |
| Tb | 1543 | 2184 | 1824 | 2065 |
| Eb | 301 | 107 | 101 | 109 |
| Hardness shore A | 83 | 82 | 80 | 85 |
| Comp, Set Resistance 200° C./70 hrs | | | | |
| Pellet | 69 | 50 | 33 | 29 |
| O-ring | 78 | 54 | 44 | 38 |

1. The compounds contained 100 parts rubber, 15 parts MT black, 3 parts of triallylisocyanurate, 5 parts Luperco 101XL peroxide.
2. The samples were press-cured at 177° C./15 mins and post-cured at 232° C. for 26 hours.

EXAMPLES b 4–6 AND CONTROL EXAMPLE B

In Examples 4–6, perfluoroelastomers were prepared from TFE/PMVE/Bromo containing fluorinated monomer with hydrocarbon alkyl iodides (RI or IRI), which provided iodo moieties on the ends of some of the polymer chains. As in Examples 1–3, the bromo cure sites in these polymers were randomly dispersed in the backbone.

The polymerization conditions were identical with those of Examples 1–3, except that methylene iodide ($ICH_2I$) was used in lieu of the 1,4-diiodoperfluorobutane, at the following flow rates.

| Example | 4 | 5 | 6 |
|---|---|---|---|
| $ICH_2I$ g/hr | 0.10 | 0.15 | 0.20 |

The methylene iodide was dissolved in t-butanol as a 10% solution and fed into the reactor because it was not soluble in F-113. The resulting polymers were compounded, cured and tested as before, and the results are shown in Table 2.

TABLE 2

IODOMODIFIED ($CH_2I_2$) BTFB CONTAINING TFE/PMVE POLYMERS

| Examples | Control B | 4 | 5 | 6 |
|---|---|---|---|---|
| Raw Polymer Description | | | | |
| TFE wt % | 55.6 | 55.9 | 56.9 | 58.9 |
| PMVE wt % | 43.2 | 43.8 | 42.7 | 40.5 |
| BTFB wt % | 1.16 | 0.22 | 0.4 | 0.44 |
| BTFB ml/kg | 0.055 | 0.025 | 0.05 | 0.055 |
| I wt % | — | 0.07 | 0.1 | 0.14 |
| I mol/kg | — | 0.006 | 0.008 | 0.011 |
| Inh. Viscosity | 0.48 | 0.47 | 0.43 | 0.39 |
| Mooney at 100° C. | — | 116 | 104 | 86 |
| 121° C. | 144.0 | 64 | 57 | 40 |
| Cured Properties | | | | |
| ODR 177° C. | | | | |
| Minimum - N.m | 1.7 | 1.15 | 0.5 | 0.6 |
| mH - N.m | 2.55 | 2.9 | 3.3 | 3.5 |
| ts2 - Mins | 1.8 | 1.4 | 1.1 | 1 |
| Tc90 - Mins | 2.5 | 2.2 | 2 | 1.9 |
| Tensiles | | | | |
| M100 | 926 | 1120 | 1310 | 1429 |
| Tb | 1543 | 2096 | 2369 | 2374 |
| Eb | 301 | 214 | 169 | 168 |
| Hardness shore A | 83 | 80 | 83 | 84 |
| Comp, Set Resistance 200° C./70 hrs | | | | |
| Pellet | 69 | 75 | 52 | 43 |
| O-ring | 78 | 58 | 50 | 47 |

1. The compounds contained 100 parts rubber, 15 parts MT black, 3 parts of triallylisocyanurate, 5 parts Luperco 101XL peroxide.
2. The samples were press-cured at 177° C./15 mins and post-cured at 288° C. for 46 hours.

I claim:
1. In a process for the preparation of perfluoropolymer by the interpolymerization of tetrafluor- oethylene, perfluoro (alkyl vinyl) ether and bromine-containing curesite monomer, the improvement wherein the reactants further comprise iodo-compounds of the formula $RI_n$, in which R is a saturated hydrrocarbon or fluorocarbon radical and n is 1 or 2.

2. A process of claim 1 wherein the bromo-containing curesite reactant is present in an amount to provide at least about 0.3%, by weight of the perfluopopolymer of the interpolymerized bromo containing moiety in the resulting perfluoropolymer, and the bromo-containing moieties are randomly distributed along the backbone of the perfluoropolymer.

3. A process of claim 2 wherein the bromo-containing moieties are present in an amount to provide about from 0.3 to 0.5% by weight of the bromine-containing moieties in the resulting perfluoropolymer.

4. A process of claim 1 wherein the iodo-compound is a di-iodo compound.

5. A process of claim 4 wherein the iodo-compound consists essentially of 1,4-diiodoperfluorobutane.

6. A process of claim 4 wherein the iodo-compound consists essentially of 1,6-diiodoperfluorohexane.

7. A process of claim 4 wherein the iodo-compound consists essentially of methylene iodide.

8. A process of claim 1 wherein the perfluoro (alkyl vinyl) ether consists essentially of perfluoro (methyl vinyl) ether.

9. A process of claim 1 wherein the perfluoro (alkyl vinyl) ether is a perfluoro (alkoxy alkyl vinyl) ether.

10. A process of claim 9 wherein the perfluoro (alkoxy alkyl vinyl) ether consists essentially of perfluoro (5-methyl-3,6-dioxa-1-nonene).

11. A process of claim 1 wherein the interpolymerization is carried out in a continuous stirred tank reactor.

* * * * *